(12) United States Patent
Utsumi

(10) Patent No.: US 8,518,278 B2
(45) Date of Patent: Aug. 27, 2013

(54) METHOD OF DRYING SUBSTRATE, AND METHOD OF MANUFACTURING IMAGE DISPLAY APPARATUS USING THE SAME

(75) Inventor: Kazushige Utsumi, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 229 days.

(21) Appl. No.: 13/204,209

(22) Filed: Aug. 5, 2011

(65) Prior Publication Data

US 2012/0061345 A1    Mar. 15, 2012

(30) Foreign Application Priority Data

Sep. 9, 2010   (JP) .................................. 2010-202169

(51) Int. Cl.
  *B08B 5/00*   (2006.01)
  *G03F 7/30*   (2006.01)
(52) U.S. Cl.
  USPC ................... 216/13; 216/41; 216/49; 216/59; 430/313; 34/487
(58) Field of Classification Search
  None
  See application file for complete search history.

(56) References Cited

U.S. PATENT DOCUMENTS

| | | | | |
|---|---|---|---|---|
| 5,762,749 | A * | 6/1998 | Suzuki et al. | 156/345.22 |
| 6,365,531 | B1 * | 4/2002 | Hayashi et al. | 134/94.1 |
| 6,421,932 | B2 * | 7/2002 | Gommori et al. | 34/488 |
| 2005/0022930 | A1 * | 2/2005 | Moriguchi et al. | 156/345.11 |
| 2006/0248745 | A1 * | 11/2006 | Viswanath et al. | 34/430 |
| 2008/0266532 | A1 * | 10/2008 | Matsuoka et al. | 355/27 |

FOREIGN PATENT DOCUMENTS

| | | |
|---|---|---|
| JP | 2003-133217 | 5/2003 |
| JP | 2007-144314 | 6/2007 |
| JP | 2007-149987 | 6/2007 |

* cited by examiner

*Primary Examiner* — Anita Alanko
(74) *Attorney, Agent, or Firm* — Fitzpatrick, Cella, Harper & Scinto

(57) ABSTRACT

A method of drying a substrate comprises: supplying a first air flow 4 downwardly in an inclined direction onto the substrate; supplying a second air flow 5 upwardly in an inclined direction onto the substrate, while moving relatively the substrate and the upper and lower blowing portions so that the substrate, from the end area as a front of the substrate, passes between the upper blowing portion and the lower blowing portion; and controlling the first and second air flows such that a velocity component of the second air flow in an upward direction perpendicular to the virtual plane is smaller than a velocity component of the first air flow in a downward direction perpendicular to the virtual plane.

9 Claims, 8 Drawing Sheets

METHOD OF DRYING SUBSTRATE, AND METHOD OF MANUFACTURING IMAGE DISPLAY APPARATUS USING THE SAME

BACKGROUND OF THE INVENTION

1. Field of the Invention

The present invention relates to a method of drying a substrate by blowing a gas onto the substrate and a method of manufacturing an image display apparatus, and particularly relates to a method of drying a substrate with the use of an air knife.

2. Description of the Related Art

A circuit pattern and the like on a glass substrate are formed by a resist film, in an image display apparatus such as a flat panel display. After the resist film has been formed, it is necessary to subject the resist film to chemical liquid treatment such as development, rinse the substrate by using rinsing water (pure water) after the chemical liquid treatment, and then dry the substrate.

A series of treatments for the substrate, which include the chemical liquid treatment, the rinsing and the drying, are usually conducted while the substrate is moved by a moving unit such as a roller conveyor, in one chamber.

Japanese Patent Application Laid-Open No. 2003-133217 discloses that an air knife is generally used for drying a substrate, drying air is simultaneously blown onto the upper surface and the lower surface of the substrate by the air knives, thereby rinsing water is blown off and removed from the surface of the substrate, the air knives are formed of a pair of upper one and lower one, and the arrangement of the air knives and the flow rate of air should be strictly vertically symmetric. In the above described series of treatments, the substrate is placed so that the surface having the resist pattern formed thereon becomes the upper surface.

It is known that when the substrate is dried, if the drying air is too strongly blown onto the upper surface of the substrate, the destruction of a resist pattern occurs, and Japanese Patent Application Laid-Open No. 2007-149987 discloses a technology of blowing drying air and then blowing hot air onto the substrate to finish drying so as to prevent the destruction of the resist pattern. Japanese Patent Application Laid-Open No. 2007-144314 discloses a technology of drying a substrate with a small amount of air, by devising a shape of a nozzle.

The above described destruction phenomenon of the resist pattern will be described below with reference to the drawings. FIGS. 10A and 10B schematically illustrate a state of the destruction of the resist pattern, which occurs when the drying air is blown onto the substrate by using the air knife. FIG. 10A is a plan view of the substrate, which is viewed from the upper side of the substrate, and FIG. 10B is a side view of the substrate, which is viewed from the transverse direction. The peeling of a resist-surface insolubilization layer 9 occurs in the same direction as that of the air supplied from the air knife, and a peeled portion 9a deposits on the resist pattern 8 to form a stripe shaped defect 10. The resist-surface insolubilization layer 9 means such a layer that the surface of an unexposed resist becomes insoluble in an aqueous solution of TMAH (tetramethylammonium hydroxide), due to an azo coupling reaction of the resin and a photosensitive agent caused by the contact of the surface of the unexposed resist with a developer such as the aqueous solution of TMAH. It is known that the resist-surface insolubilization layer 9 is generally formed so as to have a thickness of 50 to 200 nm from the surface of the resist 9b.

It is known that the stripe shaped defect 10 occurs only in the end area 3 of the substrate, when the substrate passes through the air knife. Here, the end area 3 of the substrate means the range of approximately 10 to 20 mm by the distance measured from the end 21 in a head side of the upper surface (surface having resist pattern formed thereon) of the substrate. When an effective pattern region 22 exists in the end area 3, if such a defect occurs in the effective pattern region 22, the defect results in causing a decrease of the yield. Here, the effective pattern region 22 means a region in which the resist film with a fixed thickness is formed on the surface of the substrate and the pattern can be formed, and generally means a region in the inside from the end of the substrate by a fixed distance. The reason why the thickness of the resist film is not fixed in the outside of the effective pattern region 22 includes the influence of the surface tension in the end of the substrate when the resist is coated by a spin coating method, and the instability of a pumping operation in the starting time and finishing time of a coating operation when the resist is coated by a slit coating method.

The stripe shaped defect is formed by the collision of the mist of a rinsing liquid against the surface of the substrate, which has been formed when the end area 3 is dried by the air knife and has been passed by the drying air. It is hard for the methods described in Patent documents 2 and 3 to prevent the resist-surface insolubilization layer 9 in the end area 3 of the substrate from peeling and redepositing onto the resist pattern 8, and it is difficult for the methods to solve the above described problem.

An object of the present invention is to provide a method of drying a substrate, which can suppress the occurrence of the stripe shaped defect that is formed by the redeposition of the resist-surface insolubilization layer in the end area of the substrate, which has been peeled by a blown gas, and a method of manufacturing an image display apparatus.

SUMMARY OF THE INVENTION

According to an aspect of the present invention, a method of drying, by blowing with gas, a substrate coated with a resist over an upper surface of the substrate including an end area of the upper surface, coated with a surface insolubilization layer over a surface of the resist, and then rinsed, comprises steps of: supplying a first gas flow downwardly in an inclined direction onto the substrate for drying the substrate, from an upper blowing portion positioned above a virtual plane including a center plane positioned in a center of a thickness of the substrate; supplying a second gas flow upwardly in an inclined direction onto the substrate for drying the substrate, from a lower blowing portion positioned below the virtual plane, while moving relatively the substrate and the upper and lower blowing portions so that substrate, from the end area as a front of the substrate, passes between the upper and lower blowing portions; and controlling the first and second gas flows such that a velocity component of the second gas flow in an upward direction perpendicular to the virtual plane is smaller than a velocity component of the first gas flow in a downward direction.

At a time of drying the substrate, a mist of rinsing liquid used in rinsing is produced. By means of controlling the first and second gas flows such that a velocity component of the second gas flow in an upward direction perpendicular to the virtual plane is smaller than a velocity component of the first gas flow in a downward direction, thereby suppressing the mist so as not to be directed to the upper surface of the substrate. Accordingly, the mist flowed by combined gas flows and colliding against an end area of the substrate would be reduced, thereby suppressing the forming of the stripe shaped defect in the effective pattern region.

According to the other embodiment of the present invention, the first and second gas flows are controlled, such that a first angle between a direction of the first gas flow from the upper blowing portion positioned and the virtual plane is larger than a second angle between a direction of the second gas flow from the lower blowing portion positioned and the virtual plane.

According to the further embodiment of the present invention, a method of manufacturing method of an image display apparatus comprises steps of: drying the substrate coated with the resist according to the method according to the above method of drying; forming a wiring pattern according to an etching the resist on the substrate; and arranging an image display device on the wiring pattern.

According to the present invention, there can be provided a method of drying a substrate, which can suppress the occurrence of the stripe shaped defect that is formed by the redeposition of the resist-surface insolubilization layer in the end area of the substrate, which has been peeled by a blown gas, and a method of manufacturing an image display apparatus.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Embodiments of a method of drying a substrate according to the present invention will be described below with reference to the drawings. A substrate to be a subject of the present invention may be any substrate for any application, but includes a glass substrate for a flat-plane type image display apparatus in which an electron-emitting device is formed, as an example. A resist for forming a pattern is coated on the whole surface of a face of a substrate, on which the pattern is to be formed. The resist is coated on the end area as well which is a beltlike region along the end of the substrate, but the end area is not used as a region for forming the pattern therein, because the film thickness of the end area is not stable. The width of the end area is, for instance, approximately 10 to 20 mm by the distance measured from the end in a direction perpendicular to the end. The resist to be coated on the substrate is desirably a positive resist which contains a novolak-based resin as a main component, and the film thickness of the coated resist is desirably set at 3 μm or less. The face of the substrate having the resist coated thereon is kept upward in the subsequent steps. Because of this, the face having the resist coated thereon results in being the upper surface of the substrate.

Figure 1A:
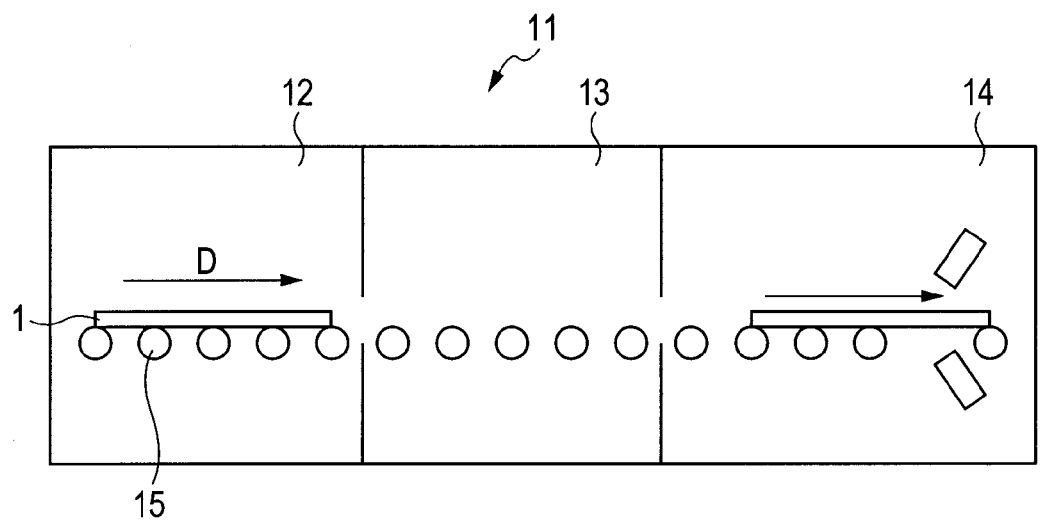
FIGS. 1A and 1B are conceptual views illustrating a configuration of a resist-development apparatus.
Figure 1B:
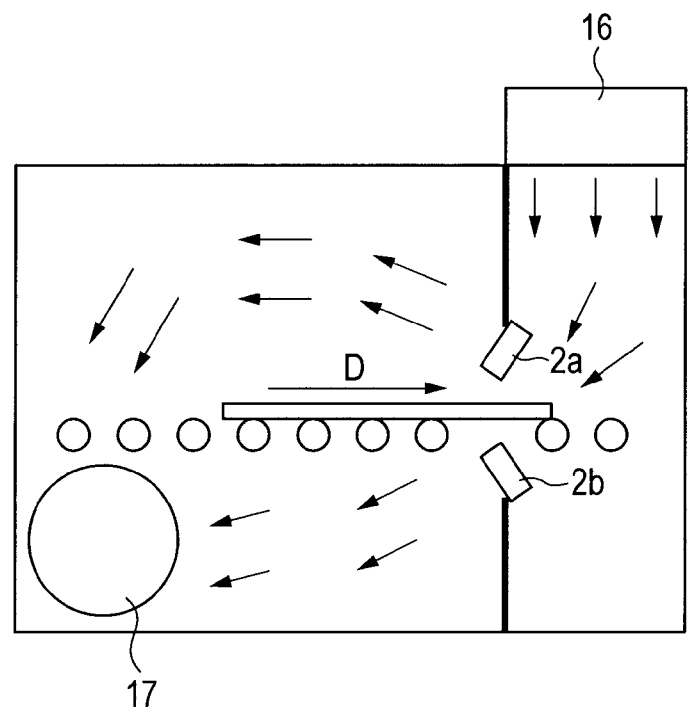

The substrate having the resist coated thereon is exposed to light by using an exposure device to have a predetermined pattern formed thereon. The exposed substrate is transported into a resist-development apparatus, and is subjected to each step of development, rinsing and drying. FIGS. 1A and 1B are conceptual views illustrating a configuration of the resist-development apparatus, FIG. 1A is a side view, and FIG. 1B is a partially enlarged view of an air knife drying tank. The resist-development apparatus 11 includes a development treatment tank 12, a rinsing tank 13, and an air knife drying tank 14 for drying the substrate. The substrate 1 is subjected to these treatments while being transported toward a transportation direction D in each of tanks 12 to 14 of the resist-development apparatus 11 by a conveyor 15. Specifically, in the development treatment tank 12, the resist is developed by an alkaline liquid and a resist-surface insolubilization layer is formed. In the rinsing tank 13, the chemical liquid (developer) which has remained on the substrate 1 is washed away with pure water. In the air knife drying tank 14, drying air is blown onto the substrate 1 from the air knife, the pure water is blown off, and the substrate 1 is dried. The transportation direction D normally matches with a horizontal direction.

As is illustrated in FIG. 1B, a HEPA (High Efficiency Particulate Air) filter 16 is provided in the downstream side of the air knife drying tank 14, and an exhaust port 17 is provided in the vicinity of the entry of the air knife drying tank 14. Accordingly, a clean air which has been filtered by the HEPA filter is passed toward the upstream side from the downstream side in the inside of the air knife drying tank 14, and the pressure in the downstream side (HEPA filter side) is set to be higher. Thereby, the mist of the pure water which has been blown off by the drying air is prevented from redepositing on the substrate 1 which has been dried.

Figure 2A:
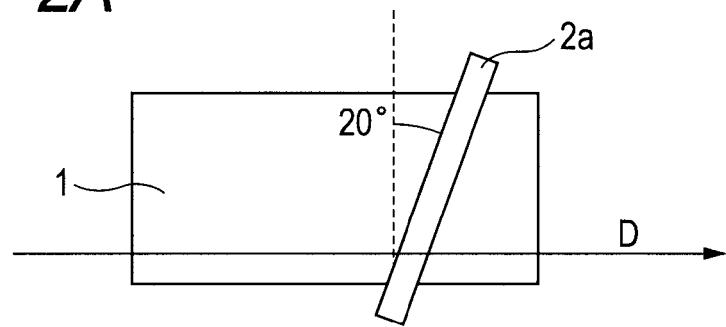
FIGS. 2A, 2B and 2C are a plan view and side views illustrating an arrangement of air knives.
Figure 2B:
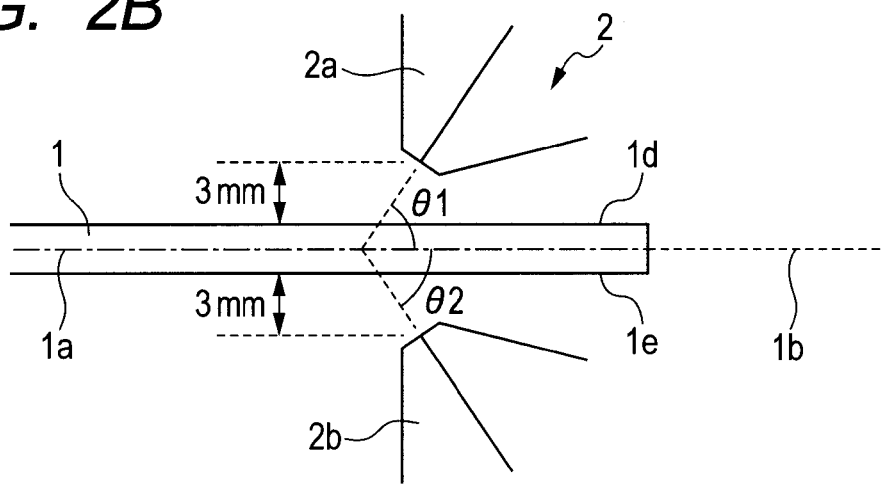
Figure 2C:
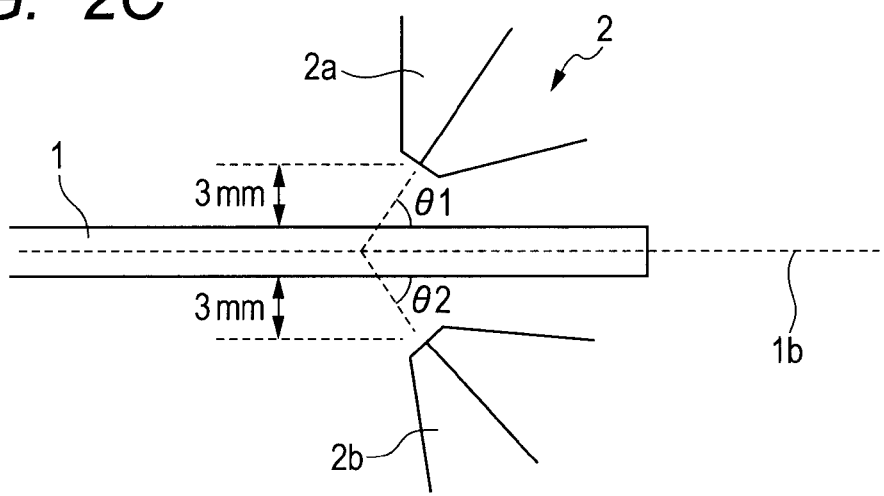
Figure 3:
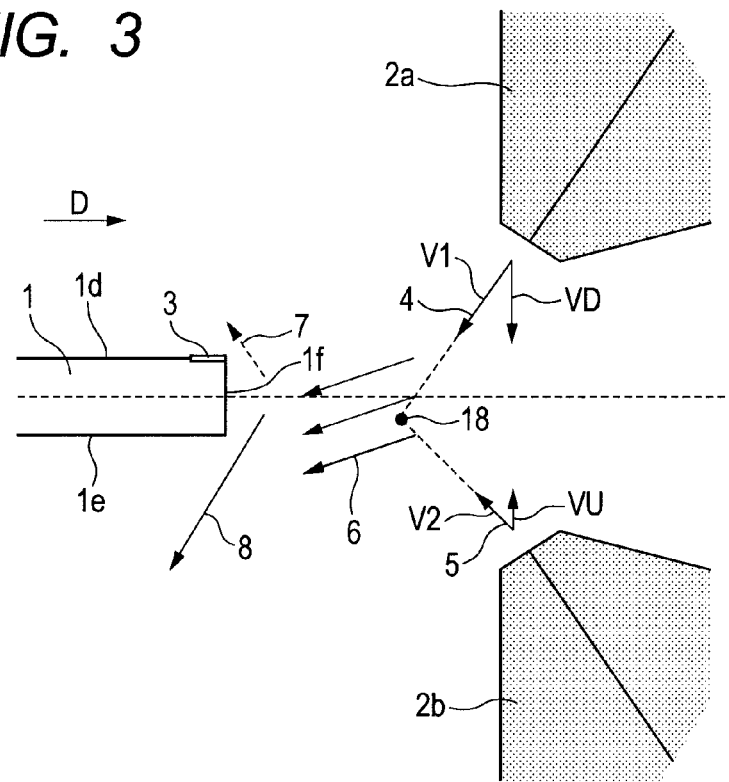
FIG. 3 is a view illustrating a state of air flows when the velocities of drying air blown from air knives have been set to be vertically asymmetric.

FIGS. 2A, 2B and 2C illustrate the arrangement of air knives. FIG. 2A is a plan view, and FIGS. 2B and 2C are side views. FIG. 3 is a view illustrating a state of air flows. An air knife 2 is a pair of air knives of an upper-side air knife 2a and a lower-side air knife 2b. The air knife 2 is a device that spouts a compressed air which has been filled in an internal chamber through a long and thin gap, and can be suitably used for the present invention. A face which is positioned in a center of a thickness of the substrate 1 is defined as a center plane 1a, and a plane including the center plane 1a is defined as a virtual plane 1b. The upper-side air knife 2a constitutes an upper blowing portion which is positioned above the virtual plane 1b, and supplies the first air flow for drying the substrate 1 downwardly in an inclined direction onto the substrate 1. The lower-side air knife 2b constitutes a lower blowing portion which is positioned below the virtual plane 1b, and supplies the second air flow 5 for drying the substrate 1 upwardly in an inclined direction onto the substrate 1.

As is illustrated in FIG. 2B, the upper-side air knife 2a and the lower-side air knife 2b are vertically symmetrically arranged with respect to the virtual plane 1b. In other words, the upper-side air knife 2a and the lower-side air knife 2b are arranged so as to have the same distance respectively from the upper surface 1*d* and the lower surface 1*e* of the substrate 1. In addition, the angle (hereinafter referred to as first angle θ1) formed by the direction of the first air flow 4 which is supplied from the upper-side air knife 2*a* and the virtual plane 1*b*, and the angle (hereinafter referred to as second angle θ2) formed by the direction of the second air flow 5 which is supplied from the lower-side air knife 2*b* and the virtual plane 1*b* are equal to each other.

The air knife 2 is arranged so as to tilt against a direction perpendicular to the transportation direction D of the substrate 1. A supply unit of the air flow is not limited to the air knife 2, but may be a pipe having a plurality of holes (nozzles) provided therein or the like. Drying air is used as a gas for drying, but the gas is not limited to the drying air as long as the gas can dry the substrate 1.

The substrate 1 passes between the upper-side air knife 2*a* and the lower-side air knife 2*b* while being transported by the conveyor 15 of a moving unit and being headed by the end area 3. In an example of FIGS. 1A and 1B, the substrate 1 moves to the right from the left, but the resist development apparatus may also have the moving unit provided in the air knife 2 to move the substrate to the left from the right. Any moving method may be employed as long as the substrate 1 and the upper-side and lower-side air knives 2*a* and 2*b* can relatively move with respect to each other, and both of the substrate 1 and the air knife 2 can be simultaneously moved.

Referring to FIG. 3, the first and second air flows 4 and 5 are blown downwardly in an inclined direction and upwardly in an inclined direction, respectively, and accordingly join on the way to form a combined air flow 6, when there is no obstacle which separates these air flows 4 and 5 from each other. Accordingly, when a substrate front if does not reach the joining point 18 at which the first and second air flows 4 and 5 join together, the combined air flow 6 is formed, and when the substrate front 1*f* has reached the joining point 18, the substrate obstructs the formation of the combined air flow 6. When the substrate front 1*f* passes through the joining point 18, the first air flow 4 and the second air flow 5 are separated by the substrate 1 and are blown onto the upper surface 1*d* and the lower surface 1*e* of the substrate 1, respectively. According to the present invention, the first and second air flows 4 and 5 are controlled so that the combined air flow 6 does not have a velocity component which is perpendicular to the virtual plane 1*b* and is upward, in the vicinity of the substrate front 1*f*, when the substrate front 1*f* has reached the vicinity of the joining point 18 at which the first air flow 4 and the second air flow 5 join together.

Figure 9:
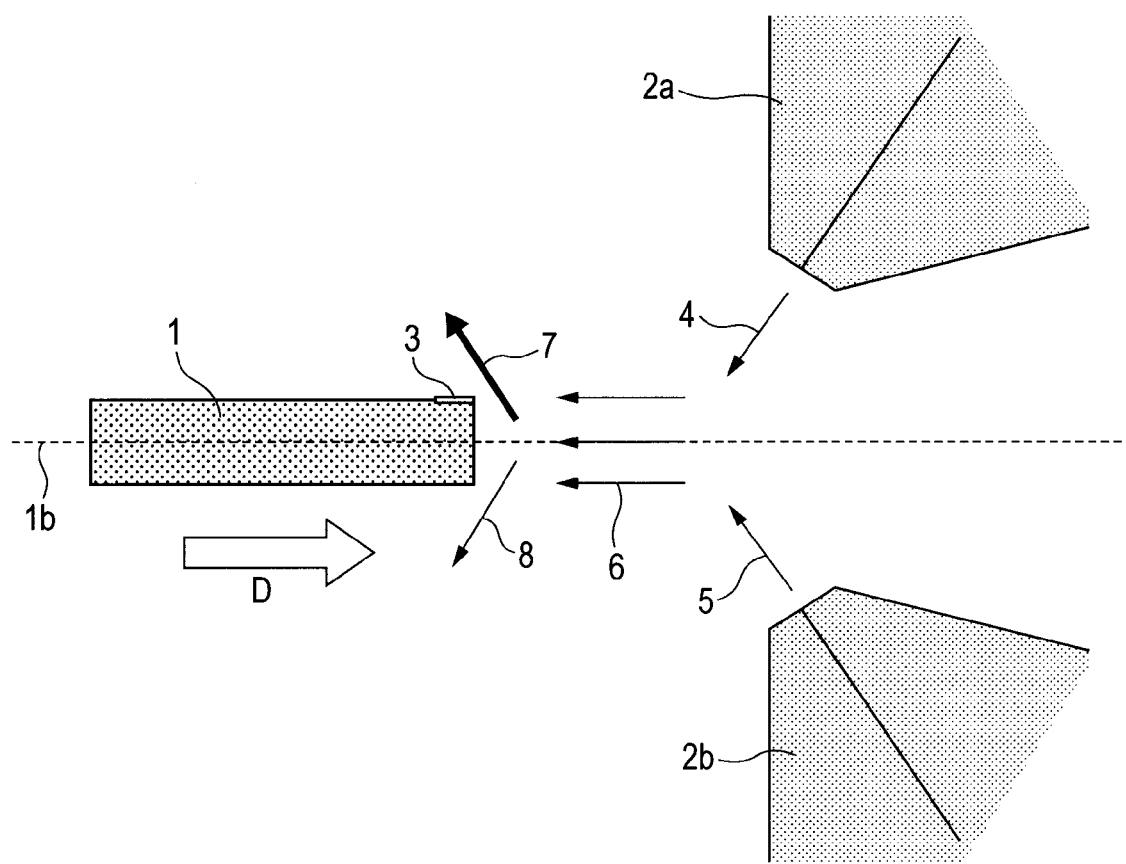
FIG. 9 is a view illustrating a state of air flows due to drying air supplied from an air knife in a conventional example.
Figure 10A:
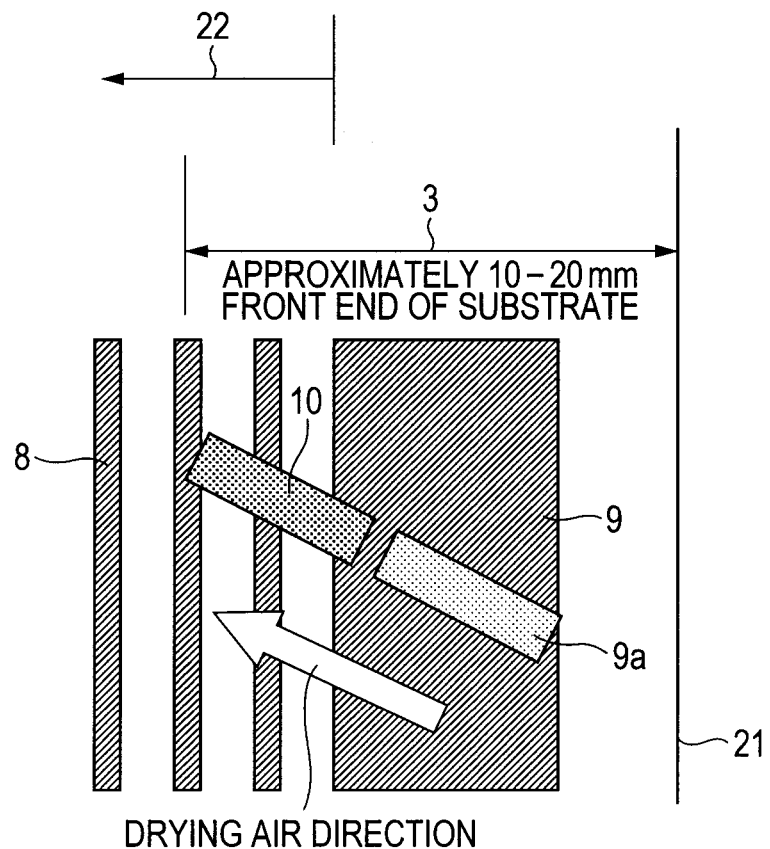
FIGS. 10A and 10B are schematic views of a stripe shaped defect occurring on a surface of a resist film.
Figure 10B:
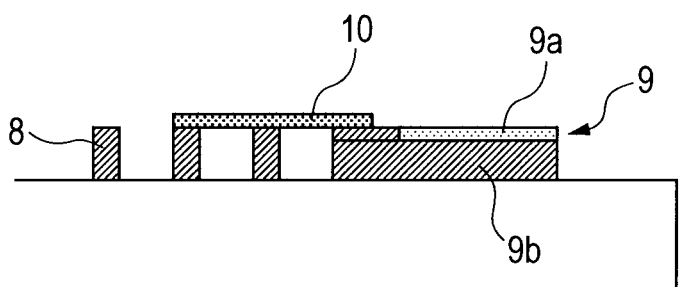

In order to realize this condition, in the present embodiment, the upward velocity component VU of the second air flow 5, which is perpendicular to the virtual plane 1*b*, is set to be smaller than a downward velocity component VD of the first air flow 4, which is perpendicular to the virtual plane 1*b*. In the present embodiment, the first angle θ1 and the second angle θ2 are equal to each other, and accordingly this condition is satisfied by setting the blowing flow velocity V2 of the second air flow 5 to be smaller than the blowing flow velocity V1 of the first air flow 4. As a result of this, the direction of the combined air flow 6 directed toward the end area 3 of the substrate front 1*f* is controlled so as not to be parallel to the virtual plane 1*b* but to tilt to a direction directed toward the lower side from the upper side, In a conventional example, as is illustrated in FIG. 9, the arrangement of the upper and lower air knives and the directions of the first and second air flows 4 and 5 are linearly symmetric with respect to the virtual plane 1*b*, and the velocities of the first and second air flows 4 and 5 are equal to each other. Accordingly, the direction of the combined air flow 6 becomes parallel to the virtual plane 1*b*. Because of this, the air flow toward the upper surface 1*d* of the substrate and the air flow toward the lower surface 1*e* of the substrate, which have been branched at the substrate front 1*f*, result in having almost the same air quantity, and an approximately half of the mist of the rinsing liquid, which has been formed when the vicinity of the substrate front 1*f* is dried, is directed to the upper side of the substrate 1. This mist rides on the drying air in the upper side of the substrate 1, collides against the upper surface 1*d* of the substrate 1, and has caused a stripe shaped defect.

In contrast to this, in the present embodiment, the first air flow 4 is supplied from the upper-side air knife 2*a*, the second air flow 5 is supplied from the lower-side air knife 2*b*, and the first air flow 4 and the second air flow 5 join to form the combined air flow 6, as is illustrated in FIG. 3. When the substrate front 1*f* has reached the joining point 18 at which the first air flow 4 and the second air flow 5 join together, the combined air flow 6 is divided into an air flow 7 directed toward the upper side of the substrate 1 and an air flow 8 directed toward the lower side of the substrate 1, at the substrate front 1*f*. Because the blowing flow velocity V2 of the second air flow 5 is smaller than the blowing flow velocity V1 of the first air flow 4, the combined air flow 6 does not flow in the direction parallel to the virtual plane 1*b* but tilts to the direction directed toward the lower side from the upper side. As a result of this, the air quantity of the air flow 7 becomes smaller than that of the air flow 8, and the mist of the rinsing liquid, which has been formed when the vicinity of the substrate front 1*f* is dried, resists being directed toward the upper surface 1*d* of the substrate 1.

Figure 4:
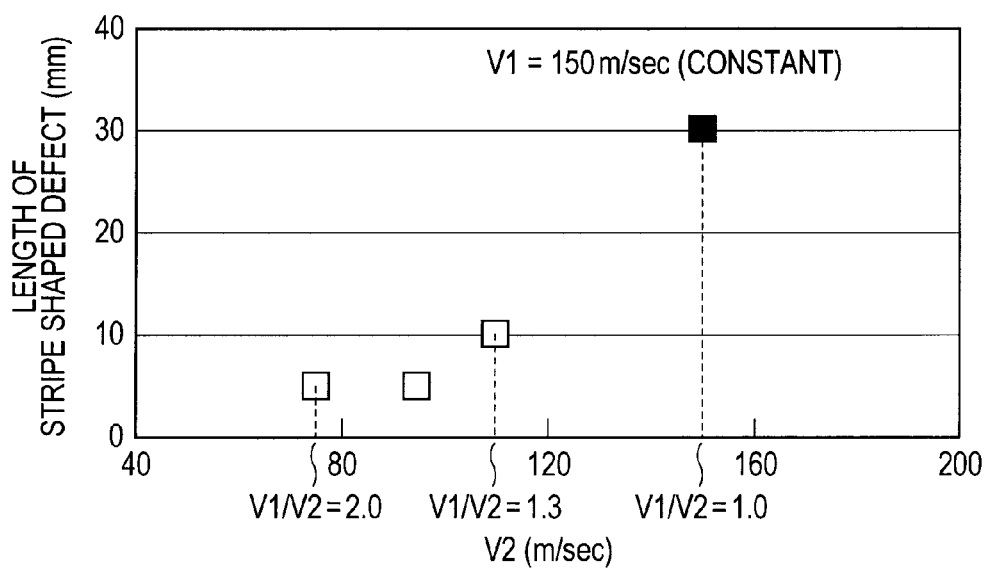
FIG. 4 is a graph illustrating a length of a defect when the velocity of drying air blown from the lower-side air knife has been varied.

FIG. 4 illustrates the length of the stripe shaped defect formed when the blowing flow velocity V1 of the first air flow 4 has been fixed to 150 m/second, and the blowing flow velocity V2 of the second air flow 5 has been varied. The condition of V2=150 m/second (point shown by black rectangle) corresponds to that of a conventional art. When V2 is decreased with respect to V1, the length of the stripe shaped defect becomes short, and particularly when V1/V2 reaches 1.3, the length of the stripe shaped defect is greatly reduced. When the length of the stripe shaped defect becomes short, the defect itself becomes insignificant, the possibility that the peeled resist-surface insolubilization layer 9 stays in the end area 3 increases, and the peeled resist-surface insolubilization layer resists entering into the effective pattern region. On the other hand, when V2 is small, the air flow to be supplied to the lower surface of the substrate 1 becomes insufficient, and accordingly the lower surface of the substrate 1 resists being dried. From the above description, the rate V1/V2 of V1 and V2 is desirably 1.3 or more and 2.0 or less. When V1/V2 is within this range, the both surfaces of the substrate 1 can be sufficiently dried, and the length of the stripe shaped defect can be controlled to a sufficiently short value.

Figure 5:
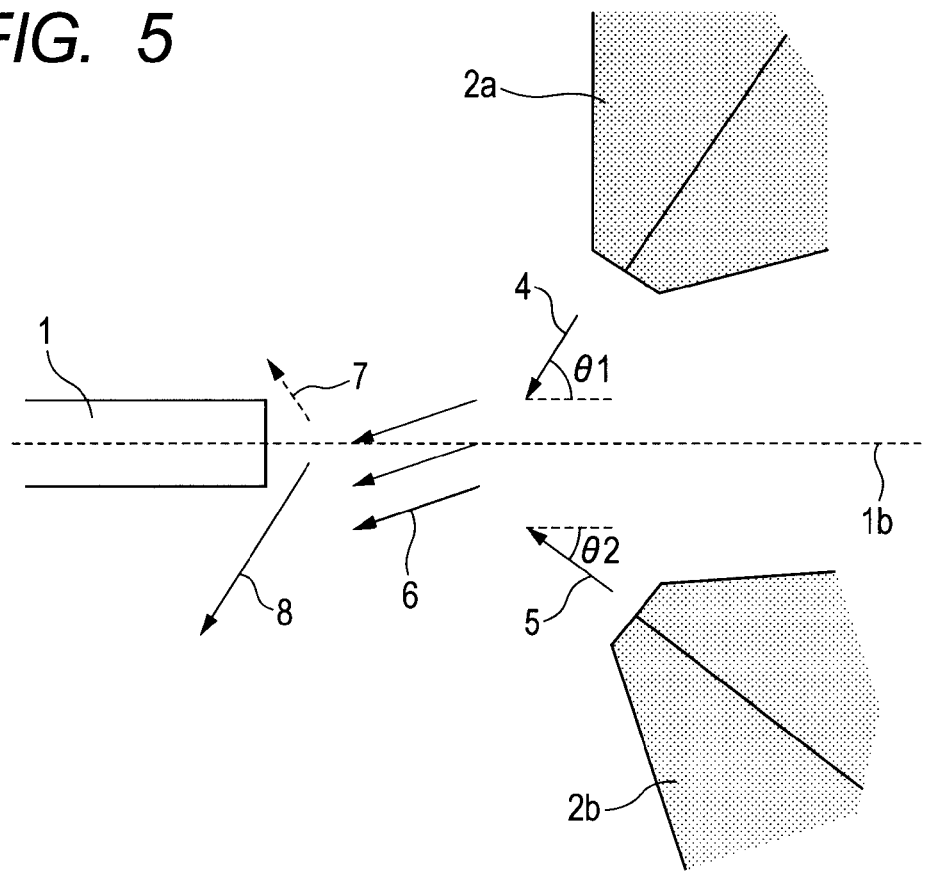
FIG. 5 is a view illustrating a state of air flows when angles formed by respective air knives and the virtual plane have been set to be vertically asymmetric.

In order to realize the above described condition, it is also possible to set the first angle θ1 to be larger than the second angle θ2. Thereby, the direction of the combined air flow 6 can be controlled so as not to be parallel to the virtual plane 1*b* but to tilt to the direction directed toward the lower side from the upper side. Referring to FIG. 5, the combined air flow 6 formed by the joining of the first air flow 4 and the second air flow 5 directed toward the substrate front 1*f* similarly to FIG. 3, and is divided into the air flow 7 directed toward the upper surface 1*d* of the substrate and the air flow 8 directed toward the lower surface 1*e* of the substrate, at the substrate front 1*f*. Here, suppose that the blowing flow velocity of the first air flow 4 and the blowing flow velocity of the second air flow 5 are equal to each other. Because a component of the second air flow 5, which is perpendicular to the virtual plane 1b, is smaller than a component of the first air flow 4, which is perpendicular to the virtual plane 1b, the combined air flow 6 does not flow in the direction parallel to the virtual plane 1b but tilts to the direction directed toward the lower side from the upper side. As a result of this, the air quantity of the air flow 7 which has been branched at the substrate front 1f and directed toward the upper side of the substrate 1 becomes relatively small, and the mist of the rinsing liquid, which has been formed when the vicinity of the substrate front 1f is dried, resists being directed toward the upper surface 1d of the substrate 1. In addition, it is also possible to set the first angle θ1 to be larger than the second angle θ2, and simultaneously to set the blowing flow velocity V2 of the second air flow 5 to be smaller than the blowing flow velocity V1 of the first air flow 4.

Figure 6:
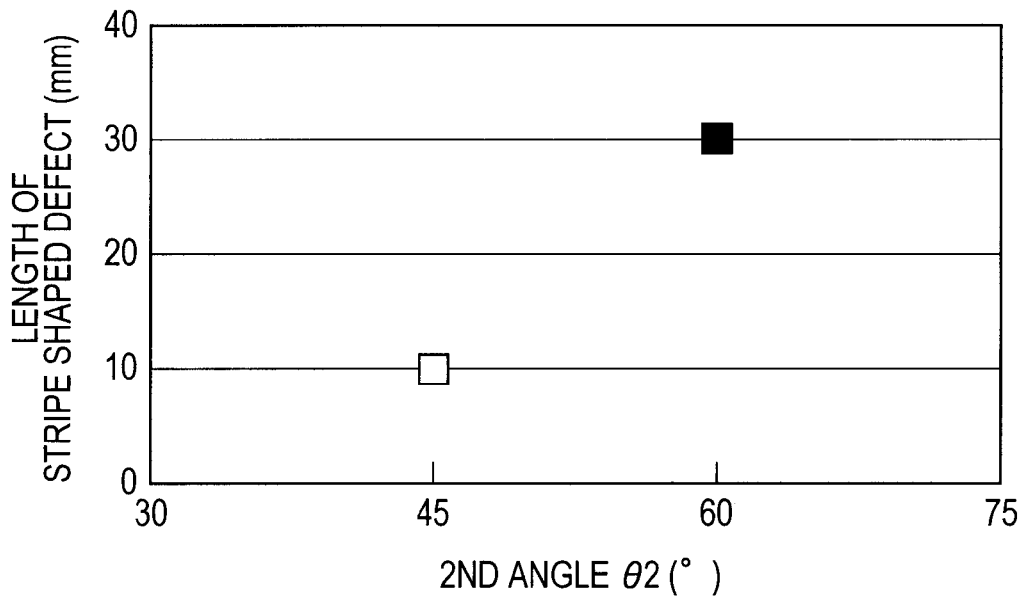
FIG. 6 is a graph illustrating a length of a defect when the second angle has been varied.

FIG. 6 illustrates the length of a stripe shaped defect formed when a first angle θ1 has been fixed at 60°, and a second angle θ2 has been varied. The condition of θ2=60° (point shown by black rectangle) corresponds to that of a conventional art. When the second angle θ2 is smaller than the first angle θ1, the length of the stripe shaped defect becomes short, and when the θ2 is decreased down to 45°, the length of the stripe shaped defect is greatly reduced. On the other hand, when θ2 is small, the lower surface of the substrate 1 resists being dried because the air flow to be supplied to the lower surface of the substrate 1 becomes insufficient. From the above description, the second angle θ2 is desirably in the range of 40° or more and 45° or less. When θ2 is within this range, the both surfaces of the substrate 1 can be sufficiently dried, and the length of the stripe shaped defect can be controlled to a sufficiently short value.

Figure 7A:
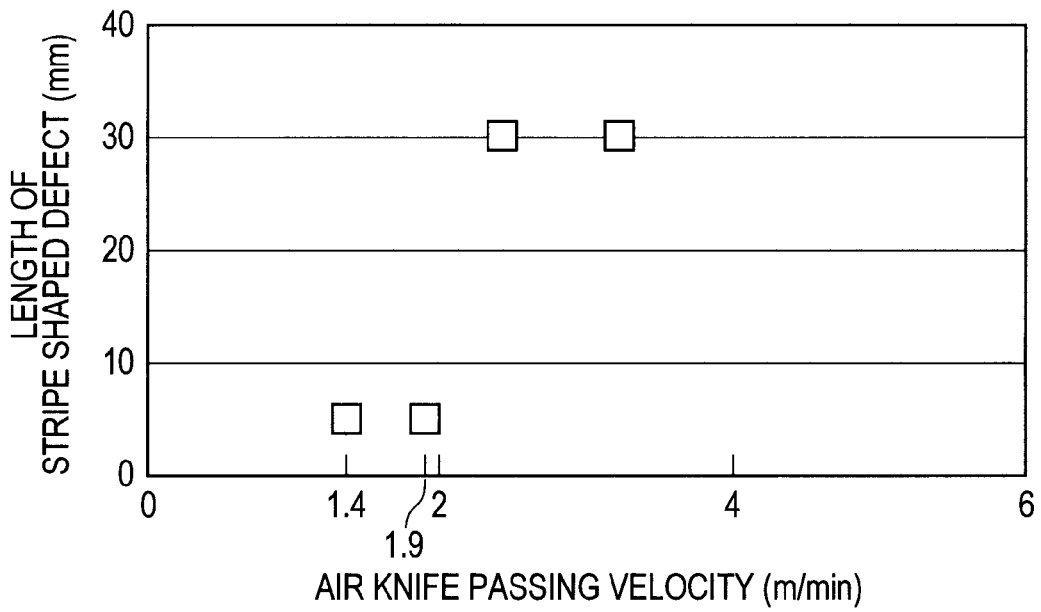
FIGS. 7A and 7B are graphs illustrating a length of a defect when the velocity of drying air blown from the upper-side air knife and a transportation velocity of a substrate have been varied.

As described above, the substrate 1 is sequentially subjected to steps of resist coating, light exposure, development, rinsing, drying and the like, and also after that, is further subjected to various treatments such as postbaking and etching. Accordingly, in order to efficiently conduct these steps, it is desirable to previously determine a period of time (tact time) to be required to each step, and finish each step within the period of time. In the drying step, the substrate 1 is transported in the inside of the resist-development apparatus 11 at a transportation velocity (relative velocity with respect to air knife) larger than a predetermined value so as to satisfy this tact time. When the tact time has been set so as to be short, it is necessary to increase the transportation velocity of the substrate 1, but when the transportation velocity is large, drying spots or remaining water droplets tend to be easily formed. When the transportation velocity is high, the stripe shaped defect tends to become long, as is illustrated in FIG. 7A. From the above description, it is desirable to select the upper limit of the tact time (lower limit of transportation velocity) so as to be kept within the tact time in the step of drying the substrate, which is specified by the whole treatment step of the substrate including the drying step. In addition, it is desirable to select the lower limit of the tact time (upper limit of transportation velocity) so that the substrate 1 is completely dried without leaving the water droplets on the surface of the substrate when the substrate has completely passed between the upper-side air knife 2a and the lower-side air knife 2b. In consideration of the above description, the transportation velocity of the substrate can be in the range of approximately 1.4 to 1.9 m/minute.

Figure 7B:
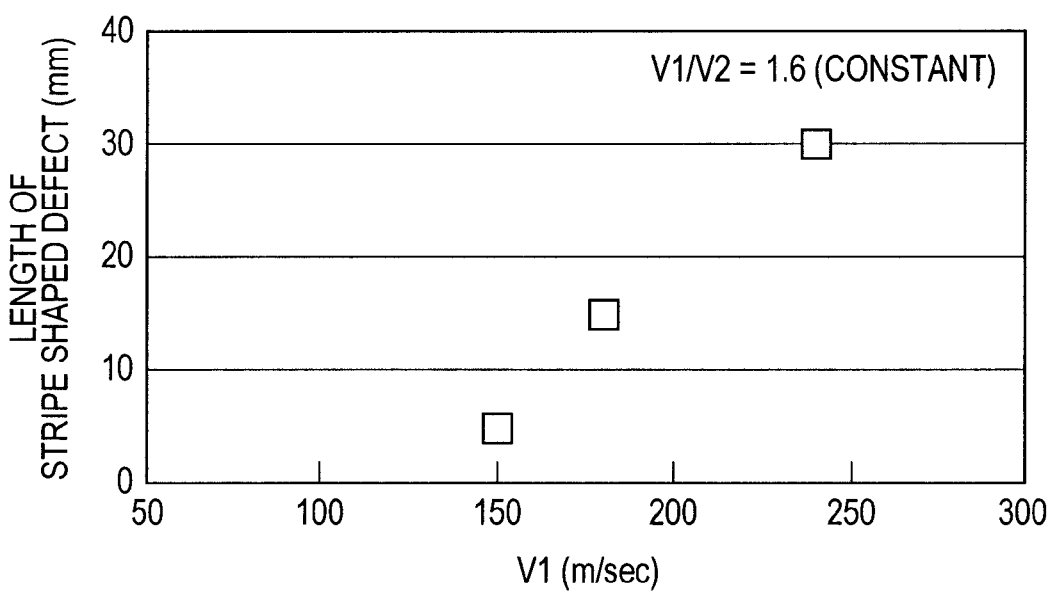

The blowing flow velocity V1 of the first air flow 4 can be arbitrarily set, but when the V1 is large, the stripe shaped defect tends to become long as is illustrated in FIG. 7B. On the other hand, when the V1 is small, the force of blowing the mist of the rinsing liquid off becomes weak, and the water droplet tends to easily remain on the upper surface 1d of the substrate. The blowing flow velocity V1 of the first air flow 4 can be set in the range of 135 m/second or more and 165 m/second or less.

(Exemplary Embodiment 1)

The present invention will be described below with reference to specific exemplary embodiments. Glass substrate 1PD200 (trade name) made by ASAHI GLASS CO., LTD. was used as a substrate 1. The substrate 1 has the shape of a rectangle in which the length in the long side is 1,330 mm and the length in the short side is 794 mm, and has a thickness of 1.8 mm. A positive resist TFR 1250PM (trade name) made by TOKYO OHKA KOGYO CO., LTD. was used as a positive resist. The viscosity of the positive resist was 0.013 Pa·s, and the solid content concentration was 23%. After the substrate 1 was rinsed with pure water and was dried, the positive resist was coated so as to have the coating film thickness of 13 μm by a slit coating method. The coated substrate 1 was placed in a vacuum chamber, the vacuum chamber was decompressed down to 13 Pa to dry the coated substrate 1, and the resultant coated substrate 1 was dried for 10 minutes by being heated at 116° C. on a hot plate. The thickness of the coating film after having been dried was 3 μm.

Subsequently, the dried substrate 1 was subjected to development treatment which employed a 2.38 wt % aqueous solution of TMAH at a temperature of 23° C. as a chemical liquid (developer). In the development treatment tank 12 illustrated in FIG. 1A, the aqueous solution of TMAH was sprayed onto the upper surface of the dried surface 1 at a pressure of 0.15 MPa for 3 minutes through a full-cone-shaped shower. The substrate 1 and the shower nozzle were swung so that the hitting force of the shower was uniformly applied over the whole surface of the substrate.

The developed substrate 1 was subjected to washing treatment with the use of pure water. In the rinsing tank 13 illustrated in FIG. 1A, the pure water was sprayed onto the upper surface 1d and the lower surface 1e of the developed substrate 1 at a pressure of 0.05 MPa for 1 minute through full-cone-shaped showers.

Subsequently, the washed substrate 1 was subjected to drying treatment with the use of the air knife 2 which was formed of a pair of upper one and lower one. In the air knife drying tank 14 illustrated in FIG. 1A, drying air was supplied to the upper surface 1d and the lower surface 1e of the washed substrate 1 to have blown the pure water off and have dried the substrate 1.

As for the shape of a jet port of air in the air knife 2 which was a pair of upper one and lower one, the length was set at 900 mm and the width was set at 0.1 mm. The flow rate of air to be supplied from the upper-side air knife 2a was 800 NL/min (1 NL is volume equivalent to 1 L at 0° C. in atmospheric pressure), and the velocity V1 of the air flow to be supplied from the upper-side air knife 2a was 150 m/second. The flow rate of air to be supplied from the lower-side air knife 2b was 500 NL/min, and the velocity V2 of the air flow to be supplied from the lower-side air knife 2b was 95 m/second. In FIG. 2A, the angle formed by the direction perpendicular to the transportation direction D of the substrate 1 in the plane parallel to the virtual plane 1b and by the air knife 2 was set at 20°. As illustrated in FIG. 2B, the distance between the substrate 1 and the air knife 2 when the substrate 1 passed between the upper-side air knife 2a and the lower-side air knife 2b was set at 3 mm, and the first angle θ1 and the second angle θ2 formed by respective directions of jetted air from the upper-side and lower-side air knives 2a and 2b and by the virtual plane 1b were set at 60°. The transportation velocity of the substrate 1 was set at 1.6 m/min. In the present exemplary embodiment, the effective pattern region in which the thickness of a resist coating film becomes stable was controlled so as to be the region which was 10 mm or more distant from the end of the substrate 1.

The combined air flow 6 of drying air supplied from the air knife 2 which is a pair of upper one and lower one takes a form as illustrated in FIG. 3. The vector of the velocity of the combined air flow 6 directed toward the substrate front 1f is not parallel to the virtual plane 1b but tilts to a direction directed toward the lower side from the upper side. Because of this, the air flow 7 directed toward the upper side of the substrate 1 after having collided against the substrate front 1f decreases compared to the case in which the flow rates of air to be supplied from the upper-side and lower-side air knives 2a and 2b are equal to each other. Thereby, the mist of the rinsing liquid decreased, which rode on the drying air in the upper side of the substrate 1 from the substrate front 1f and collided against the surface of the substrate, and the length of the stripe shaped defect could be decreased to 5 mm. This was a smaller value than the width (10 mm) of the end area 3, and the occurrence of the stripe shaped defect in the effective pattern region could be suppressed.

(Exemplary Embodiment 2)

In Exemplary Embodiment 2, the angles formed by the air knife 2 and the virtual plane were controlled to be vertically asymmetric so that the direction of the combined air flow 6 directed toward the substrate front 1f was not parallel to the virtual plane but tilted to a direction directed toward the lower side from the upper side. A substrate, a coating material, a coating method, a developer, a development method, a rinsing liquid and a rinsing method were similar to those in Exemplary Embodiment 1.

A pair of upper and lower air knives 2a and 2b were used in order to dry a washed substrate 1. In the air knife drying tank 14 of the resist-development apparatus 11 illustrated in FIG. 1A, drying air was supplied to the upper surface 1d and the lower surface 1e of the washed substrate 1 to have blown the pure water off and have dried the substrate.

As for the shape of jet ports of air in the pair of the upper and lower air knives 2a and 2b, the length was set at 900 mm and the width was set at 0.1 mm. The flow rates of air to be supplied from the pair of the upper and lower air knives 2a and 2b were both set at 800 NL/min. As illustrated in FIG. 2C, the distances between the substrate and the air knives when the washed substrate 1 passed between the upper-side air knife 2a and the lower-side air knife 2b were set at 3 mm. As illustrated in FIG. 2C, the first angle θ1 formed by the direction of jetted air from the upper-side air knife 2a and the virtual plane 1b was set at 60°, and the second angle θ2 formed by the direction of jetted air from the lower-side air knife 2b and the virtual plane 1b was set at 45°. The transportation velocity of the substrate 1 was set at 1.6 m/min. In the present exemplary embodiment, the effective pattern region in which the thickness of a resist coating film becomes stable was controlled so as to be a region which was 10 mm or more distant from the end of the substrate 1.

The combined air flow 6 of air supplied from the pair of the upper and lower air knives 2a and 2b takes a form as illustrated in FIG. 5. The vector 6 of the combined air flow 6 directed toward the substrate front 1f is not parallel to the virtual plane 1b but tilts to a direction directed toward the lower side from the upper side. Because of this, the air flow 7 directed toward the upper side of the substrate 1 after having collided against the substrate front 1f decreases compared to the case in which the angles θ1 and θ2 formed respectively by the upper and lower air knives and the virtual plane 1b are equal to each other. Thereby, the mist of the rinsing liquid decreased, which rode on the drying air in the upper side of the substrate 1 from the substrate front 1f and collided against the surface of the substrate, and the length of the stripe shaped defect could be decreased to 10 mm. This was a value equivalent to the width of the end area 3, and the occurrence of the stripe shaped defect in the effective pattern region could be suppressed.

In addition, the shape of the jet port of air in the air knife, the quantity of jetted air in the upper side, the substrate transportation velocity and the angles formed by the air knives and the virtual plane are not limited to values shown in Exemplary Embodiments 1 and 2, but can be appropriately changed according to the size and surface state of a substrate which is a subject to be dried.

(Exemplary Embodiment 3)

Figure 8A:
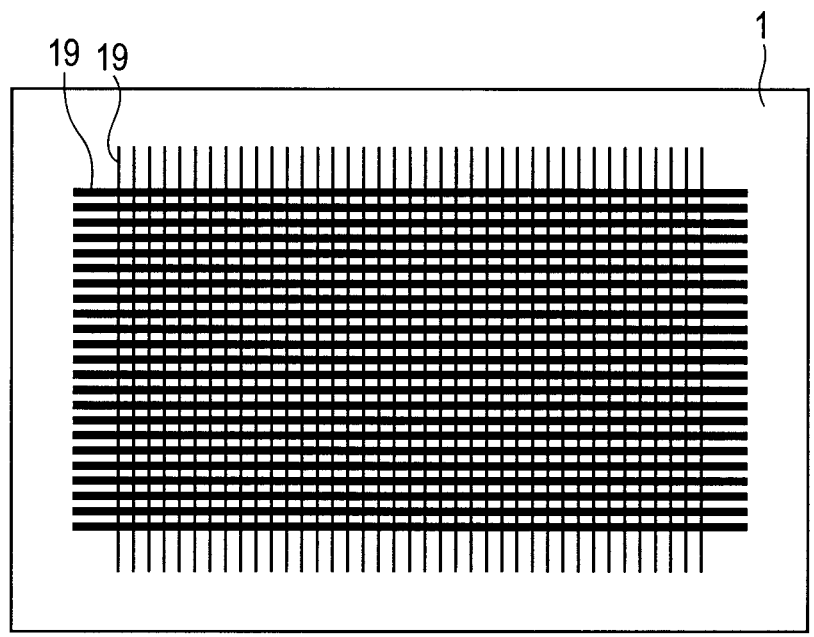
FIGS. 8A and 8B are views illustrating a matrix wiring structure of an image display apparatus.
Figure 8B:
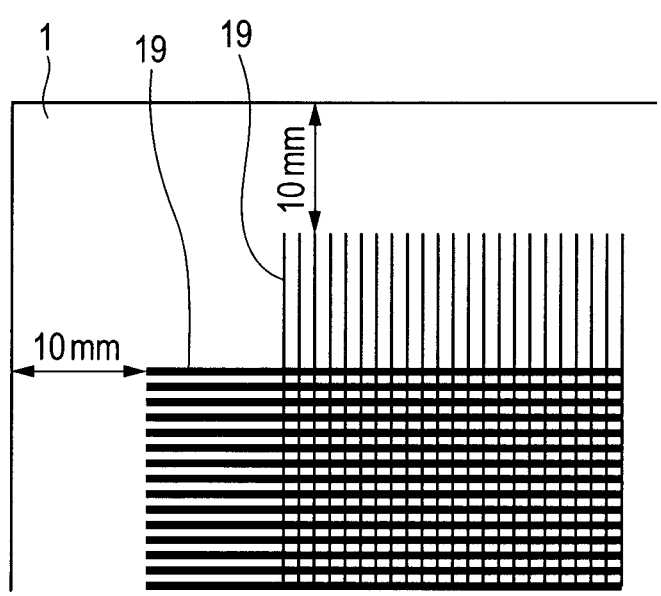

In Exemplary Embodiment 3, an image display apparatus was manufactured by using the method of drying the substrate 1. FIGS. 8A and 8B are plan views of a substrate, which illustrates the wiring having a matrix structure, FIG. 8A is the whole plan view, and FIG. 8B is a partially enlarged view.

When the image display apparatus is manufactured, it is necessary to form the wiring 19 having the matrix structure as illustrated in FIG. 8A. In the present exemplary embodiment, the wiring was formed up to a position which was 10 mm distant from the end of the substrate as was illustrated in FIG. 8B, and a region in which the wiring was formed was determined to be an effective pattern region.

Glass substrate PD200 (trade name) made by ASAHI GLASS CO., LTD. was used as the substrate 1. The substrate 1 had a shape of a rectangle in which the length in the long side was 1,330 mm and the length in the short side was 794 mm, and had a thickness of 1.8 mm.

A metal film was formed as a wiring material on the substrate 1. After that, a resist was coated on the substrate 1 having a metal film-formed thereon. A used material, a coating method and a drying method were set at those similar to Exemplary Embodiment 1. The substrate 1 having the resist coated thereon was exposed to light by using an appropriate mask, and a latent image was formed in the resist. The mask had a pattern only in a portion which was 10 mm or more distant from the end of the substrate, and did not have the pattern formed in a range within 10 mm or less from the end of the substrate. The light exposure quantity was set at 70 mJ/cm$^2$.

The exposed substrate 1 was subjected to development treatment and washing treatment. A used material, a development method and a washing method were set at those similar to Exemplary Embodiment 1.

The developed and washed substrate 1 was dried by a pair of upper and lower air knives 2a and 2b. The configuration and condition of the air knife were set at those similar to Exemplary Embodiment 1. The stripe shaped defect due to drying by the air knives did not occur on the wiring pattern which was formed in the portion which was 10 mm or more distant from the end of the substrate.

The dried substrate 1 was heated to 120° C. on the hot plate, and was subjected to postbaking treatment for 5 minutes. The postbaked substrate 1 was etched with an appropriate method, the resist was peeled with an appropriate method, and a desired wiring pattern could be formed. The image display apparatus was structured by combining this wiring pattern with an image display device.

Due to the above described procedure, the occurrence of the stripe shaped defect in the effective pattern region was suppressed when the resist pattern was formed, and a desired wiring pattern of high quality could be formed. By combining the wiring pattern in which the occurrence of the defect was suppressed with the image display device, the image display apparatus could be manufactured, which had a higher quality compared to that of a conventional image display apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-202169, filed Sep. 9, 2010, which is hereby incorporated by reference herein in its entirety.

What is claimed is:

1. A method of drying, by blowing with gas, a substrate coated with a resist having a resist surface insolubilization layer located in a surface side of the resist over an upper surface of the substrate including an end area, and then rinsed, comprising steps of:

supplying a first gas flow downwardly in an inclined direction onto the substrate for drying the substrate, from an upper blowing portion positioned above a virtual plane including a center plane positioned in a center of a thickness of the substrate;

supplying a second gas flow upwardly in an inclined direction onto the substrate for drying the substrate, from a lower blowing portion positioned below the virtual plane, while moving relatively the substrate and the upper and lower blowing portions so that substrate, from the end area as a front of the substrate, passes between the upper and lower blowing portions; and controlling the first and second gas flows such that a velocity component of the second gas flow in an upward direction perpendicular to the virtual plane is smaller than a velocity component of the first gas flow in a downward direction perpendicular to the virtual plane.

2. The method according to claim 1, wherein a rate of a blowing flow rate of the first gas flow at the upper blowing portion to a blowing flow rate of the second gas flow at the lower blowing portion is 1.3 or more and 2.0 or less.

3. A method of drying, by blowing with gas, a substrate coated with a resist having a resist surface insolubilization layer located in a surface side of the resist over an upper surface of the substrate including an end area, and then rinsed, comprising steps of:

supplying a first gas flow downwardly in an inclined direction onto the substrate for drying the substrate, from an upper blowing portion positioned above a virtual plane including a center plane positioned in a center of a thickness of the substrate;

supplying a second gas flow upwardly in an inclined direction onto the substrate for drying the substrate, from a lower blowing portion positioned below the virtual plane, while moving relatively the substrate and the upper and lower blowing portions so that substrate, from the end area as a front of the substrate, passes between the upper and lower blowing portions; and controlling the first and second gas flows such that a first angle between a direction of the first gas flow from the upper blowing portion positioned and the virtual plane is larger than a second angle between a direction of the second gas flow from the lower blowing portion positioned and the virtual plane.

4. The method according to claim 3, wherein
the first angle is 60 degrees, and the second angle is 40 degrees or more and 45 degrees or less.

5. The method according to claim 1, wherein
the first and second gas flows are supplied such that, when the front of the substrate reaches close to a point at which the first and second gas flows join together, a combined air flow of the first and second air flows has, at a position close to the front of the substrate, no velocity component in the upward direction perpendicular to the virtual plane.

6. The method according to claim 1, wherein a flow rate of the first gas flow is 135 m/sec or more and 165 m/sec or less.

7. The method according to claim 1, wherein
the upper blowing portion has an air knife supplying the first air flow, and the lower blowing portion has an air knife supplying the second air flow.

8. The method according to claim 1, wherein
a velocity of moving relatively the substrate and the upper and lower blowing portions is set larger than a predetermined speed such that no water drop remains on the surface of the substrate after complete passing of the substrate between the upper and lower blowing portions.

9. A method of manufacturing method of an image display apparatus comprising steps of:

drying the substrate coated with the resist according to the method according to claim 1;

forming a wiring pattern according to an etching the resist on the substrate; and arranging an image display device on the wiring pattern.

* * * * *